United States Patent
Hoshiya et al.

(10) Patent No.: US 7,265,948 B2
(45) Date of Patent: Sep. 4, 2007

(54) MAGNETORESISTIVE ELEMENT WITH OXIDE MAGNETIC LAYERS AND METAL MAGNETIC FILMS DEPOSITED THEREON

(75) Inventors: Hiroyuki Hoshiya, Odawara (JP); Susumu Soeya, Kodaira (JP); Kenichi Meguro, Matsuda (JP)

(73) Assignee: Hitachi Global Storage Technologies Japan, Ltd.,, Kanagawa-ken (JP)

( * ) Notice: Subject to any disclaimer, the term of this patent is extended or adjusted under 35 U.S.C. 154(b) by 0 days.

(21) Appl. No.: 11/267,186

(22) Filed: Nov. 7, 2005

(65) Prior Publication Data

US 2006/0061914 A1 Mar. 23, 2006

Related U.S. Application Data

(62) Division of application No. 10/194,308, filed on Jul. 15, 2002, now abandoned.

(30) Foreign Application Priority Data

Jul. 17, 2001 (JP) .......................... P2001-216125

(51) Int. Cl.
*G11B 5/39* (2006.01)
*G11B 5/33* (2006.01)
*G11B 5/127* (2006.01)

(52) U.S. Cl. .................. 360/324.12; 360/324.11; 360/324.2

(58) Field of Classification Search ............ 360/324.1, 360/324.11, 324.12, 324.2
See application file for complete search history.

(56) References Cited

U.S. PATENT DOCUMENTS

| | | | |
|---|---|---|---|
| 6,407,890 B1 | 6/2002 | Gill | |
| 6,501,626 B1 | 12/2002 | Gill | |
| 6,580,589 B1 | 6/2003 | Gill | |
| 6,624,986 B2 | 9/2003 | Gill | |
| 6,654,211 B2 | 11/2003 | Gill et al. | |
| 6,661,626 B2* | 12/2003 | Gill | 360/324.2 |
| 6,693,776 B2 | 2/2004 | Gill | |
| 2002/0085322 A1* | 7/2002 | Pinarbasi | 360/324.12 |
| 2002/0126426 A1* | 9/2002 | Gill | 360/324.12 |
| 2002/0126428 A1* | 9/2002 | Gill | 360/324.12 |

FOREIGN PATENT DOCUMENTS

EP 1 033 764 A2 3/2000

(Continued)

OTHER PUBLICATIONS

Digests of Academic Lectures sat the 23rd Meeting of the Magnetic Society of Japan (1999), p. 188.
H. Sakakima, M. Satomi, Y. Sugita, Y. Kawawake and H. Adachi, "Enhanced GMR in PtMn Based Spin-Valves with Specular Reflective Thin Oxide Layers", Advanced Technology Research Laboratories, Matsushita Electric Ind. Co. Ltd., p. FA-08, date not found.

(Continued)

*Primary Examiner*—William J Klimowicz
(74) *Attorney, Agent, or Firm*—Reed Smith LLP; Stanley P. Fisher, Esq.; Juan Carlos A. Marquez, Esq.

(57) ABSTRACT

No related magnetoresistive multi-layered films made from a metal magnetic film provide sufficient reproducing output power. A high-polarized layer with a thickness of 10 nm or less is formed as a Fe-rich Fe—O layer in contact with the interface of a non-magnetic intermediate layer and the resulting layers are heat treated to form a multi-layered film of ferromagnetic Fe—O layers, achieving a magnetoresistive element having high magnetoresistance.

5 Claims, 14 Drawing Sheets

FOREIGN PATENT DOCUMENTS

| | | |
|---|---|---|
| JP | 06-267742 | 3/1993 |
| JP | 07-169026 | 8/1994 |
| JP | 09-016920 | 6/1996 |
| JP | 11-097766 | 9/1997 |
| JP | 11-135857 | 10/1997 |
| JP | 2000-150985 | 10/1997 |
| JP | 11-289115 | 1/1999 |
| JP | 2000-156530 | 3/1999 |
| JP | 2000-340859 | 11/1999 |
| JP | 2000-348935 | 1/2000 |
| JP | 2000195021 A * | 7/2000 |
| WO | WO95/10123 | 9/1994 |

OTHER PUBLICATIONS

Y. Shimizu, L. Varga, S. Eguchi and A. Tanaka, "Enhancement of GMR Properties of Bottom Type Spin Valve Films with Ultra-thin Free Layer Covered with Specular Oxide Capping Layer", Digests of Intermag, 2000, p. FA-07.

Jongill Hong, Kenichi Aoshima, Junichi Kane, Kenji Noma and Hitoshi Kanai, "Control of Inter-Layer Coupling Field in Spin Valves by Thin Oxide Layer", Digests of Intermag, 2000, p. BQ-12.

Yoshihiro Tsuchiya, Masashi Sano, Satoru Araki, Haruyuki Morita and Mikio Matsuzaki, "RuRhMn and MtMn Specular Spin Valve with Magnetic Oxide Layer", Digests of Intermag 2000, p. FA-09.

Y. Kamiguichi, H. Yuasa, H. Fukuzawa, K/ Koui, H, Iwasaki and M. Sahashi, "CoFe Specular Spin Valves with a Nano Oxide Layer", Digest of Intermag, 1999. p. DB-01.

J. Z. Sun, D. W. Abraham, K, Roche and S. S. P. Parkin, "Temperature and Bias Dependence of Magnetoresistance in Doped Manganite thin Film Trilayer Junctions", Applied Physics Letters, vol. 73., No. 7., Aug. 17, 1998, pp. 1008-1010.

P. Seneor, A. Fert, J-L Maurice, F. Montaigne, F. Petroff and A. Vaures, "Large Magnetoresistance in Tunnel Junctions with an Iron Oxide Electrode", Applied Physics Letters, vol. 74., No. 26., Jun. 28, 1999, pp. 4017-4019.

English Machine-Translated Copy of JP 2000-150985.

* cited by examiner

MAGNETORESISTIVE ELEMENT WITH OXIDE MAGNETIC LAYERS AND METAL MAGNETIC FILMS DEPOSITED THEREON

CROSS-REFERENCE TO RELATED APPLICATIONS

This application is a Divisional of U.S. application Ser. No. 10/194,308 filed Jul. 15, 2002, now abandoned, and claims priority to U.S. application Ser. No. 10/194,308 filed Jul. 15, 2002, which claims priority to Japanese Patent Application No. 2001-216125 filed on Jul. 17, 2001, all of which are hereby incorporated by reference.

FIELD OF THE INVENTION

The present invention generally relates to magnetic recording/reproducing, and more particularly to a magnetic head suitable for a high-recording density magnetic recording/reproducing device and a magnetoresistive element to be used for it, and to its manufacturing method.

BACKGROUND OF THE INVENTION

A spin-valve magnetoresistive sensor using a multi-layered antiparallel pining layer and an antiferromagnetic exchange layer are disclosed in JP-A No.16929/1997. A spin-valve sensor using an antiferromagnetic coupling film is disclosed in JP-A-169026/1995. A magnetoresistive element having a second magnetic layer including a third layer made from any of materials such as oxides, on which magnetization is substantially fixed, is disclosed in JP-A-156530/2000.

The Abstracts of 23th Academic Lectures, 6aA-5 published by the Magnetics Society of Japan describes the spin valve film having a magnetization pinned layer including an ultra thin oxide layer. Digest of Intermag 2000, FA-08 describes a giant magnetoresistive (GMR) film using also a thin oxide layer. Digest of Intermag 2000, FA-07 describes the GMR film with a protective oxide film deposited on a free layer. Digest of Intermag 2000, BQ-12 describes the GMR film with a protective oxide film deposited on a free layer. Digest of Intermag 2000, FA-09 describes the spin valve film using the magnetic oxide layer. Digests of Intermag 1999, DB-01 describes the spin valve film using the pinned layer with the oxide layer inserted.

The magnetoresistive type of head, which uses a high spin-polarized oxide material in the magnetic layer to supply current perpendicular to the surface of the film is disclosed in JP-A-340859/2000. A tunnel magnetoresistive element using a high-polarized film is disclosed in JP-A-150985/2000. A magnetoresistive element using a high-polarized film on a tunnel barrier layer side is disclosed in Patent No. 3050189 (JP-A-135857/1999). A spin-polarized element, to which a ferromagnetic material and semiconductor or a half-metalic material are connected through a non-magnetic layer is disclosed in JP-A-289115/1999.

The descriptions of a ferromagnetic tunnel magnetoresistive element using $LaSrMnO_3$ as a half-metalic material are found in Applied Physics Letters, vol. 73, 1008 (1998). Applied Physics Letters, vol. 74, 4017 (1999) describes ferromagnetic tunnel magnetoresistance achieved by means of materials, iron oxide and Co.

The ferromagnetic tunnel magnetoresistive element using a half-metalic oxide layer is disclosed in JP-A-97766/1999. A magnetoresistive device using a half-metalic material such as $Fe_3O_4$ is disclosed in JP-C-504303/1996. The magnetoresistive element using the magnetic layer made from the half-metalic material is disclosed in JP-A-267742/1994. A spin valve sensor including thin oxide layers is disclosed in JA-348935/2000.

In the related art, it is impossible to successfully dispose the magnetoresistive element, which acts on an external magnetic field with sufficient sensitivity and output power and provides good characteristics with a well symmetric property, at the reproducing part of a magnetic recording device, which makes it different to implement the function indispensable to the device with a considerably high level of recording density.

A giant magnetoresistance, which is achieved by means of a multi-layered film with ferromagnetic metal layers deposited through a non-magnetic metal layer, is well known to those skilled in the art. With respect to this type of magnetoresistance, electrical resistance varies with both of magnetization formed on the ferromagnetic layer isolated by the non-magnetic layer and an orientation of the magnetization. A spin-valve structure is proposed so that said giant magnetoresistance may be applied to the magnetoresistive element. This means that the preferred output power can be supplied by achieving the structure of an antiferromagnetic film/an ferromagnetic metal layer/a non-magnetic metal layer/a soft-magnetic metal layer and by substantially fixing the magnetization of the ferromagnetic metal layer stuck fast to the antiferromagnetic film by means of an exchange coupling field induced on an interface between the antiferromagnetic film and the ferromagnetic metal layer to magnetically rotate the counterpart, that is, the soft magnetic metal layer.

Hereafter, in the following descriptions, the above-mentioned effect of magnetization fixation is simply referred to as pinned bias and the antiferromagnetic film, as a pinned bias film. In addition, the ferromagnetic metal layer, on which the above-mentioned magnetization is substantially fixed, is simply referred to as a pinned film or ferromagnetic pinned layer. Similarly, the soft magnetic metal film, which is magnetically rotated by means of the external magnetic field, is simply referred to as a free layer or soft magnetic free layer.

The pinned layer provides such a function that it has the magnetization substantially fixed so that the magnetic field may be sensed and the antiferromagnetic film may be alternatively replaced with a hard magnetic film, that is, another material, which does not affect the magnetization unless a relatively strong magnetic field is applied.

In the magnetic head using the spin valve type of magnetoresistive multi-layered film, the part composed of the ferromagnetic layer/the non-magnetic layer/the soft magnetic layer determines the magnitude of its magnetoresistance. Since the soft magnetic metal layer is one kind of ferromagnetic metal layer, the ferromagnetic metal layer-non-magnetic metal layer interface is responsible for the principle. It is known that the public known art allows improvement in MR ratio by inserting an oxide into the ferromagnetic metal layer or by oxidizing part of it. In this case, however, the oxide layer is deposited at a midpoint of the ferromagnetic metal layer but a given thickness of oxide layer is not disposed at the ferromagnetic metal layer-non-magnetic metal layer interface. That is because the oxide has generally no ferromagnetic property and dose not transmit electrons, which is a major blocking factor of magnetoresistance.

Alternatively, the method for increasing magnetoresistance by applying a material of high-polarization has been also proposed but it is very difficult to laminate thin metal films such as ferromagnetic metal layers and the compounds such as the high-polarized oxide for fabricating the magnetoresistive element. This is due to the problems that alternately laminating the high-polarized material usually composed of compounds such as oxides with metal layers may cause the high-polarized material to react to the metal layers, or may cause constituents of the material to diffuse in the metal layers to form a non-stoichiometric composition, resulting in deterioration in properties.

Further, when the thin films are laminated using the conventional film formation technique, such a problem is encountered that an amorphous or microcrystal structure or a heterogeneous crystal structure is formed. As an example, in case of magnetite ($Fe_3O_4$), which is known for a half-metalic material, the thin film formed by the sputtering method at room temperature using the target of magnetite exhibits a magnetization property of only a level ranging from one third to a half of 0.6 tesla for bulk magnetite. To achieve a good thin crystalline magnetite film, the temperature of a substrate needs to be turned up to approx. 500° C. Film formation, however, at such a higher temperature of the substrate not only makes it difficult to continuously form other metal layers and disturbs formation of ultra thin flattened metal layers, but also significantly accelerate the reactions between the high-polarized layers and other metal layers, for example, CoFe layers, interfering with formation of preferable high-polarized layers. Thus, it is practically very difficult to laminate the magnetoresistive film with high-polarized layers and metal layers deposited.

SUMMARY OF THE INVENTION

The objective of the present invention is to provide a magnetic recording device with high long-term reliability, which has an ability of high-density recording, or a magnetic head using a magnetoresistive element. More specifically, the objective of the present invention is to achieve a spin valve type of magnetoresistive element with a high MR ratio, which has a ferromagnetic compound layer made from any of materials such as oxide material with a high-polarization disposed at the interface with a non-magnetic layer to provide the magnetic recording/reproducing device employing the element.

According to the present invention, to provide the magnetic recording device, on which the magnetoresistive element using giant magnetoresistance is mounted and which has the ability of high-density recording, the spin valve type of giant magnetoresistive multi-layered film used as the magnetoresistive element, that is, the magnetoresistive element having the multi-layered composition of the soft magnetic free layer/the non-magnetic intermediate layer/the ferromagnetic pinned layer/the antiferromagnetic film must be used.

Here, the antiferromagnetic film, which applies an exchange coupling bias to substantially fix the magnetization on the ferromagnetic pinned layer, may be formed by sticking fast directly to the ferromagnetic pinned layer, or have the same effect through indirect magnetic coupling. Alternatively, instead of the antiferromagnetic film, any other bias applying means, for example, residual magnetization on the hard magnetic film or a current bias may be used.

According to the present invention, to resolve the problem with conventional devices and provide the magnetic recording/reproducing device, on which the magnetoresistive element and the magnetic head are mounted and which has the ability of high-density recording, the high-polarized layer must be disposed on at least the interface of the ferromagnetic pinned layer with the non magnetic intermediate layer. Alternatively, the high-polarized layer is deposited on at least the interface of the soft magnetic free layer with the non-magnetic intermediate layer. The high-polarized layer may be deposited on the interface between the non-magnetic intermediate layers of both of the ferromagnetic pinned layer and the soft magnetic free layer. From the standpoint of correcting soft magnetic property and magnetostriction, the high-polarized layer is easy to use for the ferromagnetic pinned layer. The composition, which is formed as a multi-layered construction of the first ferromagnetic layer/the non-magnetic inserted layer/the second ferromagnetic layer, is employed.

The high-polarized layer, which is disposed on the interface sticking fast to the non-magnetic intermediate layer, may be made from any of ferromagnetic compounds such as half-metal or a mixture of the ferromagnetic compound and a metal and in particular, Fe—O layer is preferably used. The Fe—O layer is formed by continuously laminating together with other metal layers alternately at room temperature or the substrate temperature of 200° C. or lower using any of methods such as sputtering followed by heat-treating the layer to deposit $Fe_3O_4$ or $Fe_3O_{4-x}$ in the Fe—O layer. Here, the Fe—O layer is made from Fe, in which oxygen atoms are dissolved, the ferromagnetic oxide such as magnetite, the Fe mixture with the ferromagnetic oxide such as magnetite, or $Fe_3O_{4-x}$, (x is a range of values 0-3, and preferably a range of values 2-3), and preferably is formed into the composition with a less oxygen content than that of the stoichiometric composition of magnetite ($Fe_3O_4$).

By heat treating the Fe—O layer, which has a crystal structure wherein oxygen atoms are exclusively dissolved in Fe in an amorphous or microcrystal state as deposition, at an appropriate temperature of 200-400° C., the composition close to the binary Fe—O system in the equilibrium state, that is, a phase with a high-polarization to allow the magnetoresistance to change by inducing the phenomenon of crystal precipitation in the direction near to the binary Fe—$Fe_3O_4$ phases can be formed in the layer. The use of above-mentioned manufacturing method and composition not only enables the high-polarized layer with good crystallinity, and in particular, the magnetite-containing layer to be formed, but also to reduce the ferromagnetic coupling field, a so called interlayer coupling field, generated between the ferromagnetic pinned layer and the soft magnetic free layer.

Alternatively, with respect to the high-polarized layer, a so-called ferrite composition, which is the composition with Fe partially replaced with Ni, Co, Mn, Cr, or Mn, may be used for the primary component. Since the high-polarized layer exhibits ferromagnetism, the ferromagnetic pinned layer or the soft magnetic free layer may be composed of the high poralizability of layer alone, although by laminating with the high-polarized layer, the metallic ferromagnetic material, and so on, any of structures such as the structure of the high-polarized layer/CoFe layer/Ru layer/CoFe layer/antiferromagnetic layer can be formed for achieving a higher MR ratio and exchange coupling field, as well as appropriate waveform symmetry property. Alternatively, the structure of the high-polarized layer/CoFe layer/NiFe layer can be formed as the soft magnetic free layer to achieve a higher MR ratio and soft magnetic property.

The thickness of the high-polarized layer can be made 0.5 nm or more to improve the rate of resistance magnetization and the thickness below 5 nm make the soft magnetic property better with an effect that the interlayer coupling field is reduced. In particular, the thickness, any of a range 1-3 nm, is preferable because both of higher MR ratio and reduced interlayer coupling field can be achieved.

Cu is preferably used for the non-magnetic intermediate layer, however, any of conductive metals such as Au, Ag, Al, Pt, Pd, Os, Re, Ru, and Rh may be used if appropriate, or alloys with any of them may be used.

At least one pair of electrodes, which sense the output when current is supplied, are disposed at the magnetoresistive element composing a multi-layered composition. The current is supplied parallel to the layer structure of the multi-layered composition to sense giant magnetoresistance due to scattering on the interface. Alternatively, the current is supplied perpendicular to the layer structure of the multi-layered composition to cause polarized electrons in the high-polarized layer to transmit the interface and generate magnetoresistance for sensing magnetoresistance.

The magnetoresistive element may have a single magnetic domain structure to prevent noise from occurring by making the soft magnetic free layer into the single domain magnetic structure. For example, the hard magnetic film, which has residual magnetization at its ends along the film surface of the magnetoresistive element and perpendicular to the orientation of magnetic field to be sensed, is disposed. Alternatively, the single magnetic domain is achieved by disposing, for example, the hard magnetic film having residual magnetization adjacent to the magnetoresistive element along its film thickness to form the same shape of ends on the hard magnetic film and the multi-layered composition of the magnetoresistive element.

According to the present invention, in the magnetoresistive element using the materials and composition, and in the magnetic recording/reproducing device with the magnetoresistive element incorporated in the reproducing part, high-density recording, that is, recording with short recording wavelengths, which are written on the recording medium, and narrow widths of recording tracks, is achieved, enabling sufficient reproducing output to ensure better recording.

As mentioned above, according to the present invention, a magnetoresistive element with a better bias property and high output power and a magnetic head using it can be achieved and in particular, the magnetic head and a high recording-density of magnetic recording/reproducing device with a better reproducing output and bias property can be achieved.

BRIEF DESCRIPTION OF THE DRAWINGS

The present invention will be described in more detail with reference to the accompanying drawings, in which.

DETAILED DESCRIPTION OF THE PREFERRED EMBODIMENTS

Embodiment 1

A thin film making up a giant magnetoresistive element multi-layered film according to the present invention is fabricated by radio-frequency magnetron sputtering equipment as described below. In the atmosphere, in which 1-6 mm Torr of argon is present, the materials described below are sequentially laminated on a ceramic substrate with a thickness of 1 mm to form the thin film. Tantalum, nickel-20 at % iron alloy, cupper, cobalt, MnPt, ruthenium, and $Fe_3O_4$ (magnetite) are used for sputtering targets. One square cm of Fe and Ni chips are appropriately disposed on a Co target for adjusting the composition. Similarly, one square cm of, for example, Fe chips are disposed on the magnetite target for adjusting the composition.

Hereafter, the composition with the Fe—O layer formed is expressed by the total amount of magnetite ($Fe_3O_4$) plus Fe, for example, the expression Fe10 at % in the Fe—O layer means $Fe_3O_4$ 90 at %-Fe10 at %.

To sequentially form individual layers of the multi-layered film, plasma is generated in equipment by applying radio-frequency of current to individual cathodes disposed at the target and then shutters disposed at the individual cathodes are opened and closed one by one. When the film is formed, an approx. 80 oersted of magnetic field is applied parallel to the substrate using a permanent magnet to give uniaxial anisotropy. The formed film is heat-treated in the magnetic field under the vacuum condition at 270° C. for three hours to transform the phase of the antiferromagnetic film, which results in deposition of the high-polarized compound layer in the Fe—O layer, and measure magnetoresistance at room temperature. Elements are patterned on a substrate by being subjected to the photoresist process. After then, the substrate is slider-processed and mounted on the magnetic recording device.

Figure 1:
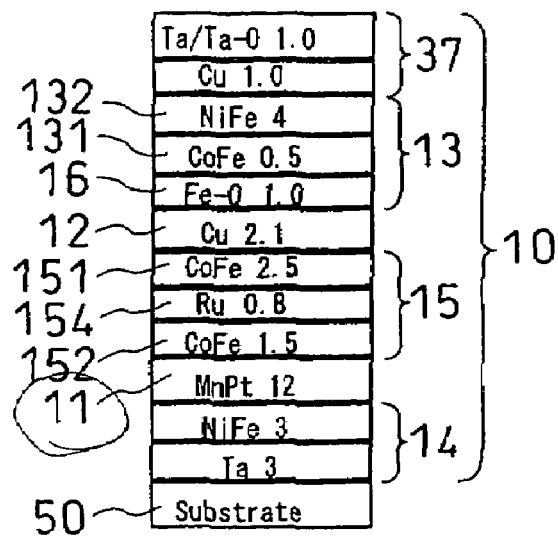
FIG. 1 is a sectional view showing a multi-layered composition of a magnetoresistive multi-layered film according to an embodiment of the present invention.

FIG. 1 is a view showing an example of the composition of a magnetoresistive multi-layered film to be used for a magnetoresistive element. In the notation of the figure, for example, "Ta3" expresses a component material as an example of the multi-layered composition and its thickness in nm.

This means that according to an embodiment illustrated in the figure, the magnetoresistive multi-layered film 10 is formed by continuously laminating a underlayer film 14, an antiferromagnetic film 11, a ferromagnetic pinned layer 15, a non-magnetic intermediate layer 12, a soft magnetic free layer 13, and a protective film 37 on the substrate 50. In the multi-layered composition, electric resistance varies with an angle defined between the magnetization orientation of the ferromagnetic pinned layer 15 and that of the soft magnetic free layer 13 by means of giant magnetoresistance or tunnel magnetoresistance.

The underlayer film 14 of the magnetoresistive multi-layered film 10 improves the crystallinity and crystalline orientation of part on the underlayer film 14 of the magnetoresistive multi-layered film 10. The underlayer film 14 has a Ta/NiFe composition but may have another composition. The use of the composition with no underlayer film 14 formed does not act counter to the objective of the present invention.

The most important purpose in the example composition illustrated in FIG. 1 is the composition of the soft magnetic free layer 13. In FIG. 1, the soft magnetic free layer 13 is shown by a multi-layered construction comprising the high-polarized layer 16, the first soft magnetic film 131, and the second soft magnetic film 132. For example, as shown in the figure, this is applied to achieve a higher MR ratio by means of the high-polarized layer 16 sticking to the non-magnetic intermediate layer 12, the first soft magnetic film on the side where the high-polarized layer 16 sticks is formed using a relatively thin layer of Co alloy, for example, $Co_{90}Fe_{10}$ alloy or $Co_{80}Fe_8Ni_{12}$ alloy to control the diffusion and mixture of the high-polarized layer 16 and the second soft magnetic film 132, the second soft magnetic film on the side of the non-magnetic intermediate layer 12 is formed using, for example, a relatively thick layer NiFe alloy for implementing the multi-layered film with better soft magnetic property and higher MR ratio.

Since the multi-layered construction is formed so that it may magnetically couple with the counterpart, the magnetization state in the same orientation is used to magnetically handle as a single body. To implement the magnetization state, the high-polarized film 16, the first soft magnetic film 132, and the second soft magnetic film 131, which form the soft magnetic free layer 13, are directly laminated with no intermediate layer deposited or if any layer exists between them, the thickness of the layer is set to an appropriate value, in particular 1 nm or less to made it thinner. Unlike the example shown in the figure, it does not act counter to the purpose of the present invention that the soft magnetic free layer 13 is composed of the multilayer of the high-polarized layer 16/the first soft magnetic film 131, or alternatively, it is made from the third or more multilayer in addition to the first and second ferromagnetic films. The factors such as the magnitude of magnetization anisotropy is set so that the orientation, in which the soft magnetic free layer 13 is magnetized, may be the same as that of an approximate track width with no magnetic field applied. The high-polarized layer 16 is preferably made from the compound such as half-metal with high-polarization, for example, $Fe_3O_4$ and in particular, more preferably made from a Fe-rich Fe—O film or a Fe—O film containing less oxygen than $Fe_3O_4$, or alternatively, Fe may be partially replaced with Mn, Cr, Ni, or Co. Further, the high-polarized layer 16 with a thickness of 10 nm or less, in particular of any of 0.5-3 nm, has a superior magnetic property, reduces the interlayer coupling between the soft magnetic free layer 13 and the ferromagnetic pinned layer 15, and exhibits high magnetoresistance.

The ferromagnetic pinned layer 15 is formed using the first ferromagnetic film 151 on the side where it sticks to the non-magnetic intermediate layer 12, the second ferromagnetic film 152 on the side where it sticks to a pinned bias applying means represented by the antiferromagnetic film 11, and an antiparallel coupling layer 154 inserted between the first and second ferromagnetic films and coupled so that the first ferromagnetic film 151 and the second ferromagnetic film 152 may have antiferromagnetic property, that is antiparallel magnetization. The composition have effects that the output of the static magnetic field from the patterned end of the ferromagnetic pinned layer may be adjusted and when used for a magnetic head, it may make reproducing symmetric property better. Thus, the composition of the ferromagnetic pinned layer including the antiparallel coupling layer is effective when applied to the magnetic head. Note that the use of the composition containing no antiparallel coupling layer does not act contrast to the purpose of the present invention if it is employed in other compositions and applications.

Embodiment 2

Figure 2:
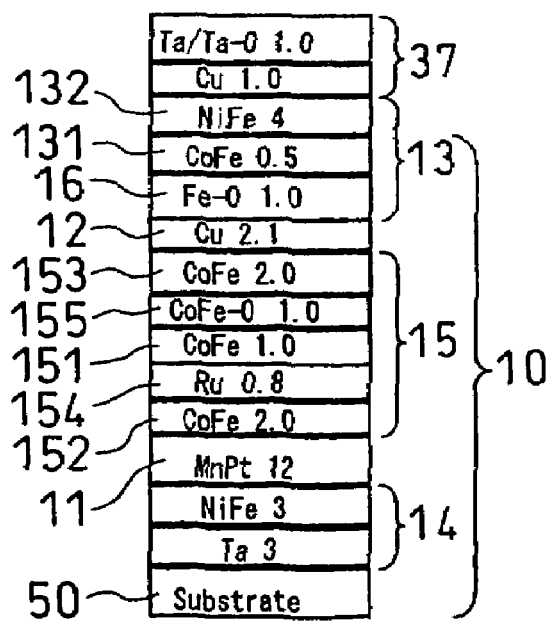
FIG. 2 is a sectional view showing a multi-layered composition of a magnetoresistive multi-layered film according to an embodiment of the present invention.

Similarly, FIG. 2 shows another example composition of the magnetoresistive multi-layered film to be used for the magnetoresistive element according to the prevent invention. The notation in the figure is the same as that of FIG. 1. The magnetoresistive multi-layered film 10 is formed by continuously laminating the underlayer film 14, antiferromagnetic film 11, ferromagnetic pinned layer 15, non-magnetic intermediate layer 12, the soft magnetic free layer 13, and the protective film 37 on the substrate 50. With respect to the multi-layered composition, electric resistance varies with the angle defined between the magnetization orientation of the ferromagnetic pinned layer 15 and that of the soft magnetic free layer 13 by means of giant magnetoresistance or tunnel magnetoresistance. Since the compositions and effects of the underlayer film 14 and the like, the soft magnetic free layer 13, and the like are the same as those shown in FIG. 1, their descriptions are omitted. If the compositions of the underlayer film 14, the soft magnetic free layer 13, and the like are somewhat different from those in the figure, it does not act counter to the purpose of the present invention.

The most important purpose of this example of the present invention is in that an oxide-inserting layer 155 is included in the composition of the ferromagnetic pinned layer 15. As shown in the figure, the ferromagnetic pinned layer 15 is formed using a third ferromagnetic film 153 sticking to the non-magnetic intermediate layer 12, the second ferromagnetic film 152 on the side where it sticks to the pinned bias applying means represented by the antiferromagnetic film 11, the first ferromagnetic film 151 antiferromagnetically coupling to the second ferromagnetic film through the antiparallel coupling film 154, and the oxide inserting layer 155 inserted between the first ferromagnetic film 151 and the third ferromagnetic film 153, which increases the crystallinity of the third ferromagnetic film 153 to enhance the MR ratio.

The composition of the ferromagnetic pinned layer containing the antiparallel coupling layer is effective in application to the magnetic head. Note that the use of the composition containing no antiparallel coupling layer does not act contrary to the purpose of the present invention if it is employed in other compositions or applications.

The oxide inserting layer 155 with 1 nm thickness retained couples ferromagnetically between the third ferromagnetic film 153 and the first ferromagnetic film 151 through the oxide inserting layer 155 and enables the third ferromagnetic film 153 and the first ferromagnetic film 151 to function as single magnetization. By combining the composition containing the oxide inserting layer 155 with the soft magnetic free layer 13, which has the high-polarized layer 16 at the interface with the non-magnetic intermediate layer 12, crystallinity is improved and high MR ratio is achieved.

Embodiment 3

Figure 3:
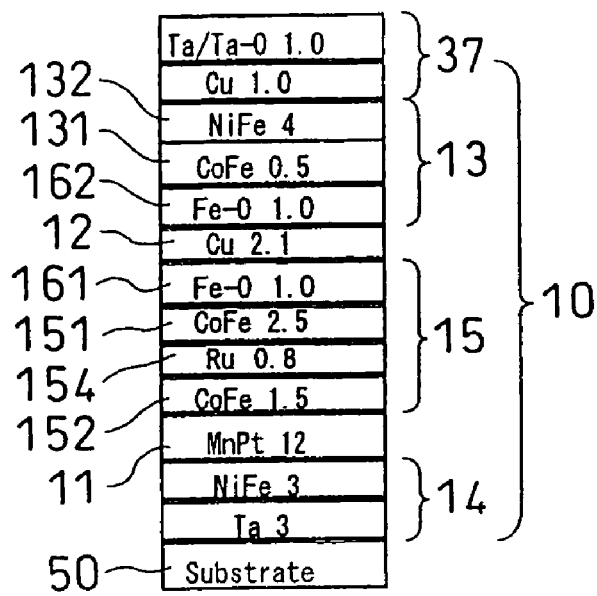
FIG. 3 is a sectional view showing a multi-layered composition of a magnetoresistive multi-layered film according to an embodiment of the present invention.

FIG. 3 is the view showing a further another example of the magnetoresistive multi-layered film to be used for the magnetoresistive element of the present invention. The notation in the figure is the same as that shown in FIG. 1. The magnetoresistive multi-layered film 10 is formed by continuously laminating the underlayer film 14, the antiferromagnetic film 11, ferromagnetic pinned layer 15, non-magnetic intermediate layer 12, the soft magnetic free layer 13, and the protective film 37 on the substrate 50.

With respect to the multi-layered composition, electric resistance varies with the angle defined between the magnetization orientation of the ferromagnetic pinned layer 15 and that of the soft magnetic free layer 13 by means of giant magnetoresistance or tunnel magnetoresistance. Since the compositions and effects of the underlayer film 14 and the like are the same as those shown in FIG. 1, their descriptions are omitted. If the composition of the underlayer film 14 or any other part are somewhat different from that in the figure, it does not act counter to the purpose of the present invention.

The most important purpose of this example of the present invention is in that high-polarized layers 162 and 161 are included in the compositions of the soft magnetic free layer 13 and the ferromagnetic pinned layer 15, respectively. As shown in the figure, the ferromagnetic pinned layer 15 is formed using the high-polarized layer 161 (i.e., a third ferromagnetic film) sticking to the non-magnetic intermediate layer 12, the second ferromagnetic film 152 on the side where it sticks to the pinned bias applying means represented by the antiferromagnetic film 11, the first ferromagnetic film 151 antiferromagnetically coupling to the second ferromagnetic film 152 through the antiparallel coupling film 154, and the high-polarized layer 161 sticking to the non-magnetic intermediate layer 12 at the interface. The composition of the ferromagnetic pinned layer containing the antiparallel coupling layer is effective in application to the magnetic head. Note that the use of the composition containing no antiparallel coupling layer does not act contrary to the purpose of the present invention if it is employed in other compositions or applications.

The soft magnetic free layer 13 formed according to the composition has a continuous multi-layered composition, which is ferromagnetically coupled so that it implements the magnetization process as one magnetic film. Similarly, the soft magnetic free layer 13 is made from the multilayer of the high-polarized layer 162 sticking to the non-magnetic intermediate layer 12 at the interface, the first soft magnetic film 131, and the second magnetic film 132. The second soft magnetic film 132 may be omitted. Two high-polarized layers 161 and 162 are adjacent one another through the non-magnetic intermediate layer 12, inducing magnetoresistance. The high-polarized thin layers with a thickness of 1-2 nm, in particular, reduce the interlayer coupling field.

Embodiment 4

Figure 4:
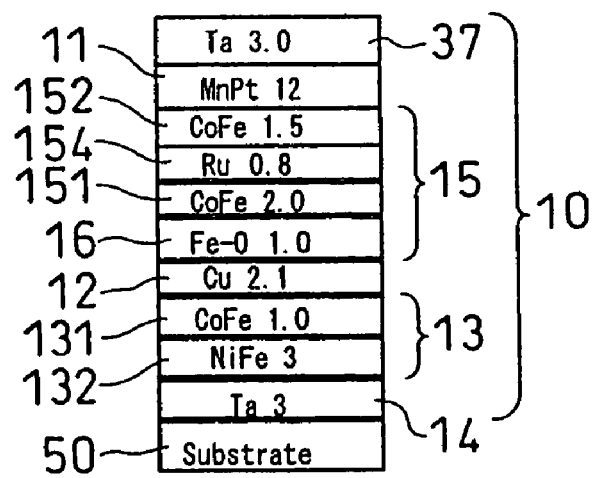
FIG. 4 is a sectional view showing a multi-layered composition of a magnetoresistive multi-layered film according to an embodiment of the present invention.

FIG. 4 is the view showing a further another example of the magnetoresistive multi-layered film to be used for the magnetoresistive element of the present invention. The notation in the figure is the same as that shown in FIG. 1. The magnetoresistive multi-layered film 10 is formed by continuously laminating the underlayer film 14, the soft magnetic free layer 13, the non-magnetic intermediate layer 12, the ferromagnetic pinned layer 15, the antiferromagnetic film 11, and the protective film 37 on the substrate 50. With respect to the multi-layered composition, electric resistance varies with the angle defined between the magnetization orientation of the ferromagnetic pinned layer 15 and that of the soft magnetic free layer 13 by means of giant magnetoresistance or tunnel magnetoresistance. Since the compositions and effects of the underlayer film 14 and the like are the same as those shown in FIG. 1, their descriptions are omitted. If the composition of the underlayer film 14 and the like are somewhat different from those in the figure, it does not act counter to the purpose of the present invention.

The important purpose of this example of the present invention is in that high-polarized layer 16 is included in the composition of the ferromagnetic pinned layer 15. As shown in the figure, the ferromagnetic pinned layer 15 is formed using the high-polarized layer 16 sticking to the non-magnetic intermediate layer 12, the second ferromagnetic film 152 on the side where it sticks to the pinned bias applying means represented by the antiferromagnetic film 11, and the first ferromagnetic film 151 antiferromagnetically coupling to the second ferromagnetic film 152 through the antiparallel coupling film 154. The composition of the ferromagnetic pinned layer 15 containing the antiparallel coupling layer 154 is effective in application to the magnetic head. Note that the use of the composition containing no antiparallel coupling layer 154 does not act contrary to the purpose of the present invention if it is employed in other compositions or applications.

The soft magnetic free layer 13 formed according to the composition has a continuous multi-layered composition, which is ferromagnetically coupled so that it implements the magnetization process as one magnetic film. A magnetostriction or an inserting layer to improve the magnetic property and crystallinity may be included between the soft magnetic free layer 13 and the underlayer film 14. The high-polarized layer 16 are adjacent to the soft free layer 13, in particular, the first soft magnetic film 131, through the non-magnetic intermediate layer 12, inducing magnetoresistance. The high-polarized thin layer 16 with a thickness of approx. 1-2 nm, reduces, in particular, the interlayer coupling field.

Embodiment 5

Figure 5:
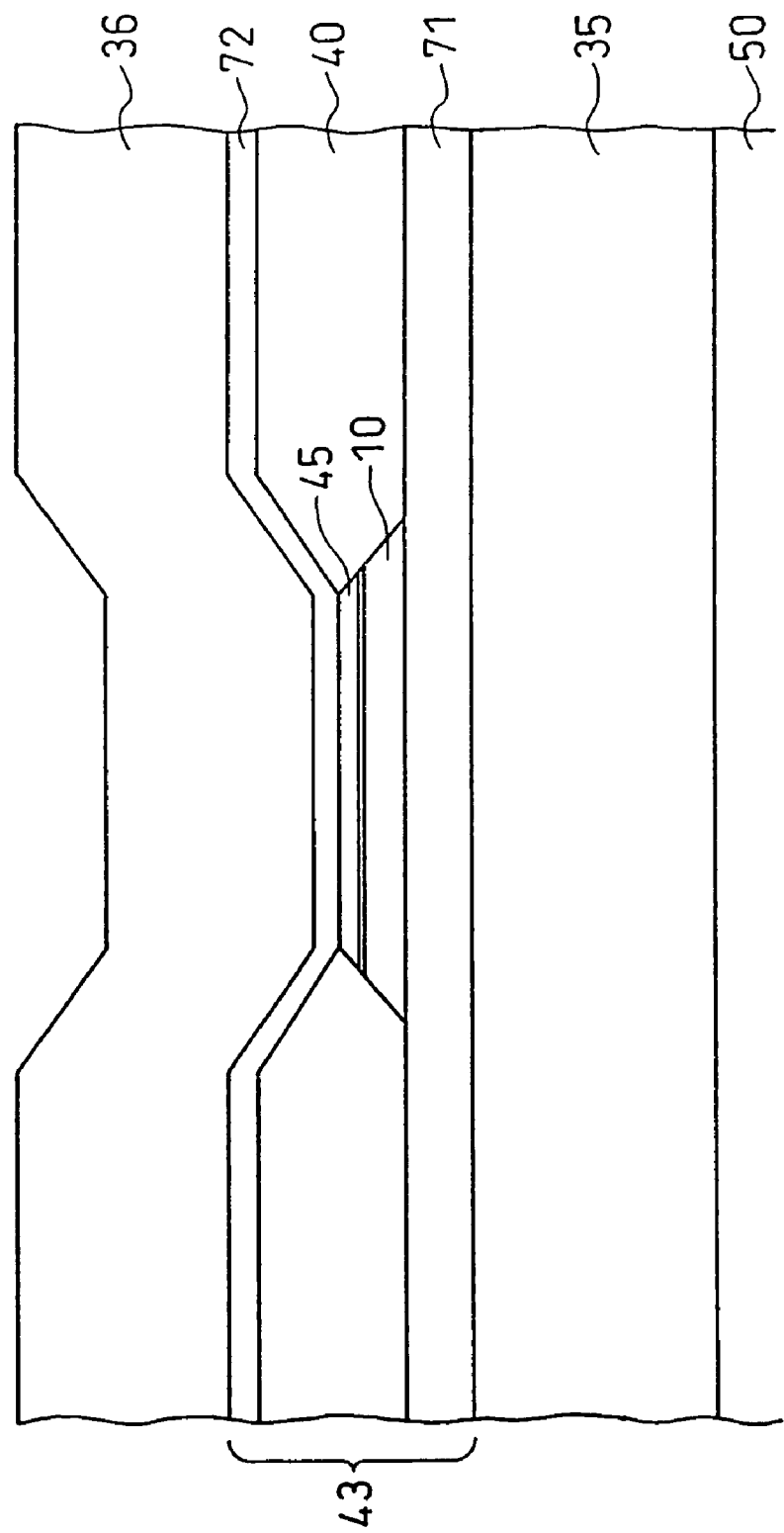
FIG. 5 is a main sectional view showing a magnetoresistive head according to an embodiment of the present invention.

FIG. 5 is a sectional view facing to a magnetic medium showing an example of the composition of the magnetoresistive head using the magnetoresistive multi-layered film of the present invention. The left-right direction on the paper indicates the direction of the track width on the magnetic head and the width on the paper indicates the direction of the element height.

The magnetic head according to the embodiment, is formed by laminating a lower magnetic shield 35, and a lower gap shield film 71 on the substrate 50, on which the magnetoresistive multi-layered film 10 and a magnetic domain control film 45 are deposited, further on which an upper gap shield film 72 and a upper magnetic shield 36 are deposited to form a reproducing gap 43 for detecting reproduced signals. An electrode 40 is disposed in contact with the magnetoresistive multi-layered film 10 to detect any application of sensing current or any change in electric resistance. The magnetic domain control film 45, which is formed using the magnetic film having residual magnetization by means of coupling to the hard magnetic film or the antiferromagnetic film and the like, is deposited slightly apart from the magnetoresistive multi-layered film 10 so that it may induce bias effects on the magnetoresistive multi-layered film 10 for insulting the single magnetic domain.

In the example, the composition of the magnetoresistive multi-layered film 10 may be the same as those described in the embodiments 1-4, although it is preferable that the magnetic domain control film 45 is composed so that the soft magnetic free layer is disposed on the lamination surface side. The producing magnetic gap 43 retains the magnetoresistive multi-layered film 10 at the rough center of the gap, allowing the magnetic signal component leaking into the reproducing magnetic gap 43 to be reproduced at a high resolution.

Embodiment 6

Figure 6:
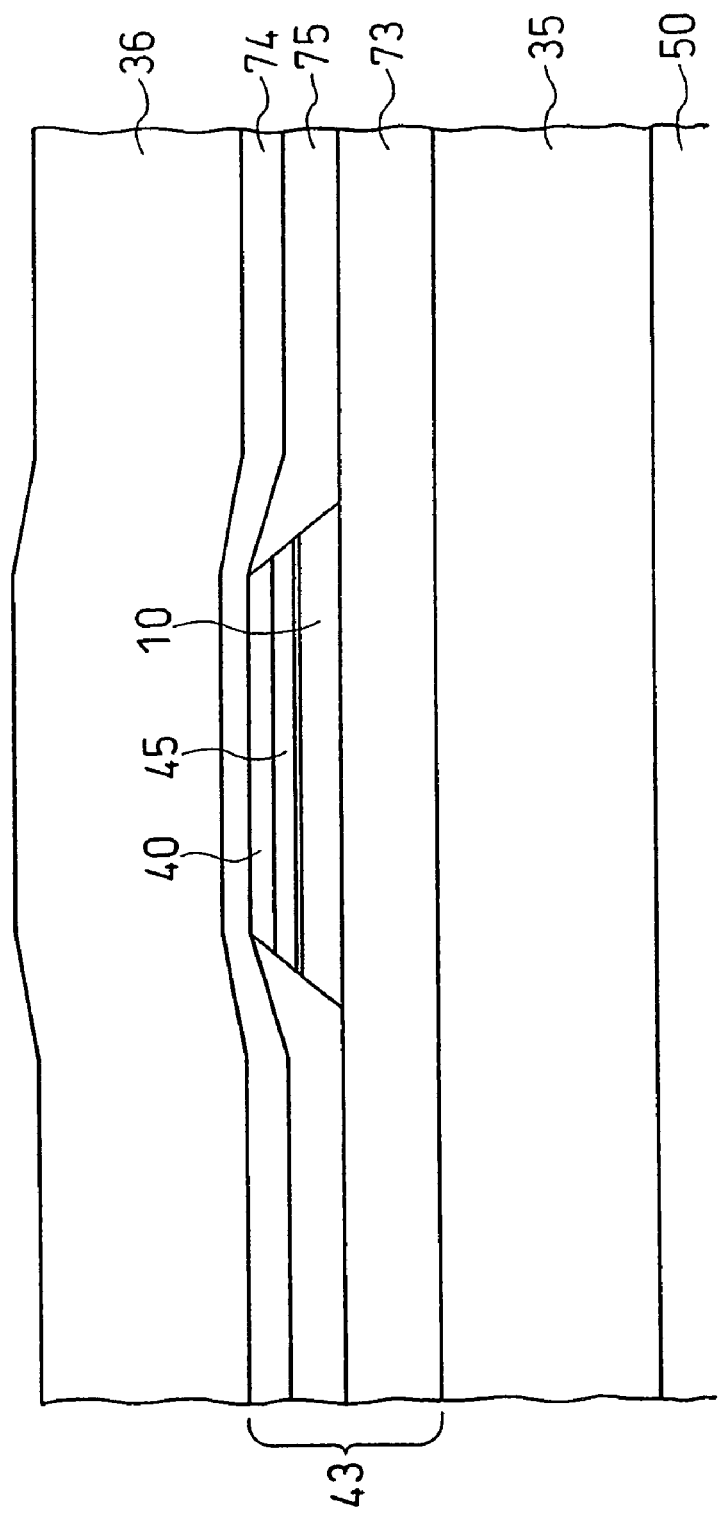
FIG. 6 is a main sectional view showing a magnetoresistive head according to an embodiment of the present invention.

FIG. 6 is a sectional view facing to a magnetic medium showing another example of the composition of the magnetoresistive head using the magnetoresistive multi-layered film of the present invention. Similar to FIG. 5, the left-right direction on the paper indicates the direction of the track width on the magnetic head and the width on the paper indicates the direction of the element height.

The magnetic head according to the embodiment, is formed by laminating the lower magnetic shield 35, and a lower gap shield film 73 on the substrate 50, on which the magnetoresistive multi-layered film 10 and the magnetic domain control film 45 are deposited, further on which an upper gap shield film 74 and the upper magnetic shield 36 are deposited to form the reproducing gap 43 for detecting reproduced signals. The electrode 40 is disposed in contact with the magnetoresistive multi-layered film 10 and the magnetic domain control film 45 to detect any change in electric resistance when sensing current is supplied in the direction of the thickness of the magnetoresistive multi-layered film 10.

Here, the magnetic domain control film 45, which is formed using the magnetic film having residual magnetization by means of exchange coupling to the hard magnetic film or the antiferromagnetic film, is deposited slightly apart from the magnetoresistive multi-layered film 10 so that it may induce bias effects on the magnetoresistive multi-layered film 10 for insulting the single magnetic domain.

In the example, the composition of the magnetoresistive multi-layered film 10 may be the same as those described in the embodiments 1-4, although it is preferable that the magnetic control film 45 is composed so that the soft magnetic free layer is disposed on the lamination surface side. In the figure, an example of the antiferromagnetic film 11 with the same width as that of any other parts of the magnetoresistive multi-layered film 10 is formed, although the antiferromagnetic film with the size changed may be composed so that current bypasses the antiferromagnetic film 11. The producing magnetic gap 43 retains the magnetoresistive multi-layered film 10 at the rough center of the gap, allowing the magnetic signal component leaking into the reproducing magnetic gap 43 to be reproduced at a high resolution.

Embodiment 7

Figure 7:
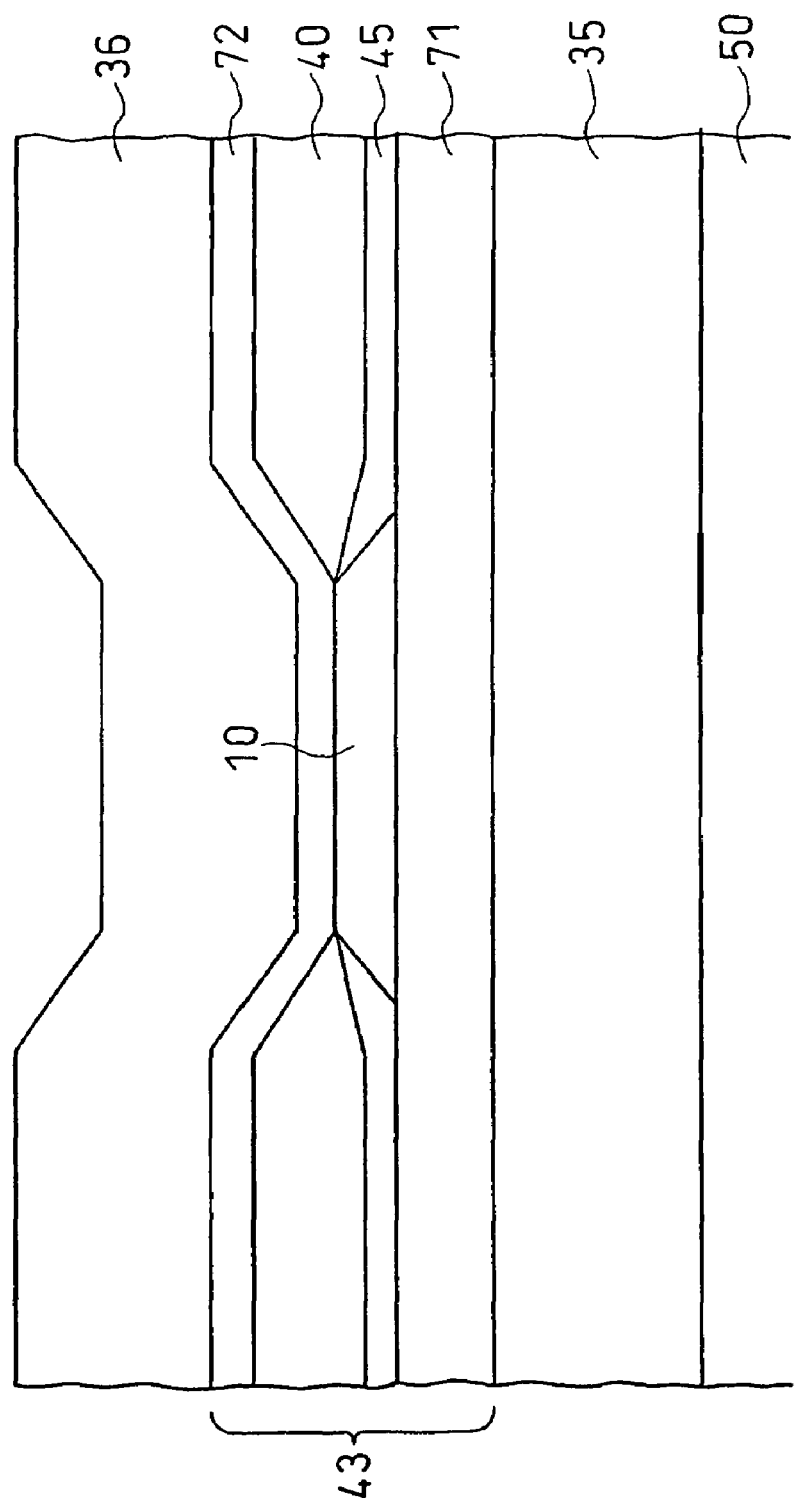
FIG. 7 is a main sectional view showing a magnetoresistive head according to an embodiment of the present invention.

FIG. 7 is a sectional view facing to a magnetic medium showing further another example of the composition of the magnetoresistive head using the magnetoresistive multi-layered film of the present invention. Similar to FIG. 5, the left-right direction on the paper indicates the direction of the track width on the magnetic head and the width on the paper indicates the direction of the element height.

The magnetic head according to the embodiment, is formed by laminating the lower magnetic shield 35 and the lower gap shield film 71 on the substrate 50, on which the magnetoresistive multi-layered film 10 is deposited, further on which the upper gap shield film 72 and the upper magnetic shield 36 are deposited to form the reproducing gap 43 for detecting reproduced signals. The electrode 40 is disposed directly at the magnetoresistive multi-layered film 10 to detect any application of sensing current or any change in electric resistance. The magnetic domain control film 45, which is formed using the magnetic film having residual magnetization by means of exchange coupling to the hard magnetic film or the antiferromagnetic film, is deposited so that its ends may roughly come into contact with the left and right sides of the magnetoresistive multi-layered film 10, allowing it to have bias effects on the magnetoresistive multi-layered film 10. The producing magnetic gap 43 retains the magnetoresistive multi-layered film 10 at the rough center of the gap, allowing the magnetic signal component leaking into the reproducing magnetic gap 43 to be reproduced at a high resolution.

Figure 8:
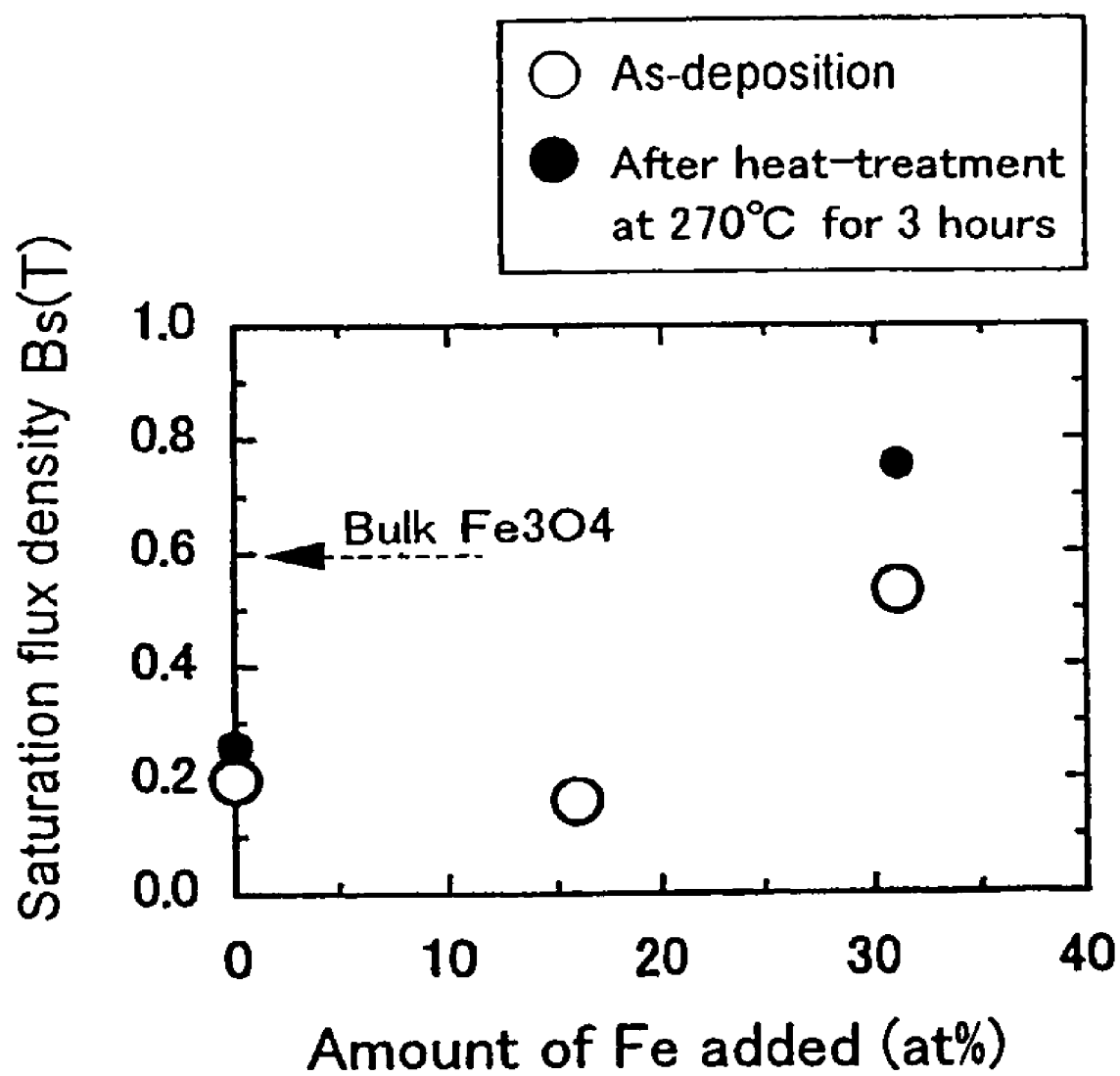
FIG. 8 is a characteristic drawing showing the relationship between the compositions of a Fe—O film and saturation flux densities.

FIG. 8 is a view showing the relationship between the composition of the Fe—O film and a saturation magnetic flux density. The Fe—O layer is formed as single-layer film with a thickness of approx. 0.3 μm for easy measurement. The saturation magnetic flux density of the Fe—O film containing no Fe, which is made by the sputtering method using the magnetite ($Fe_3O_4$) target, is 0.2 tesla at film formation, at most 0.3 tesla or lower after three-hour heat-treatment at 270° C., which is a half or lower of 0.6 tesla at saturated magnetization of bulk magnetite ($Fe_3O_4$). On the other hand, the saturation magnetic flux density of the Fe—O film with approx. 30 at % of Fe added is 0.5 tesla before heat-treatment and 0.7 tesla or more after heat-treatment. At that time, the magnetization might be induced by Fe.

Figure 9:
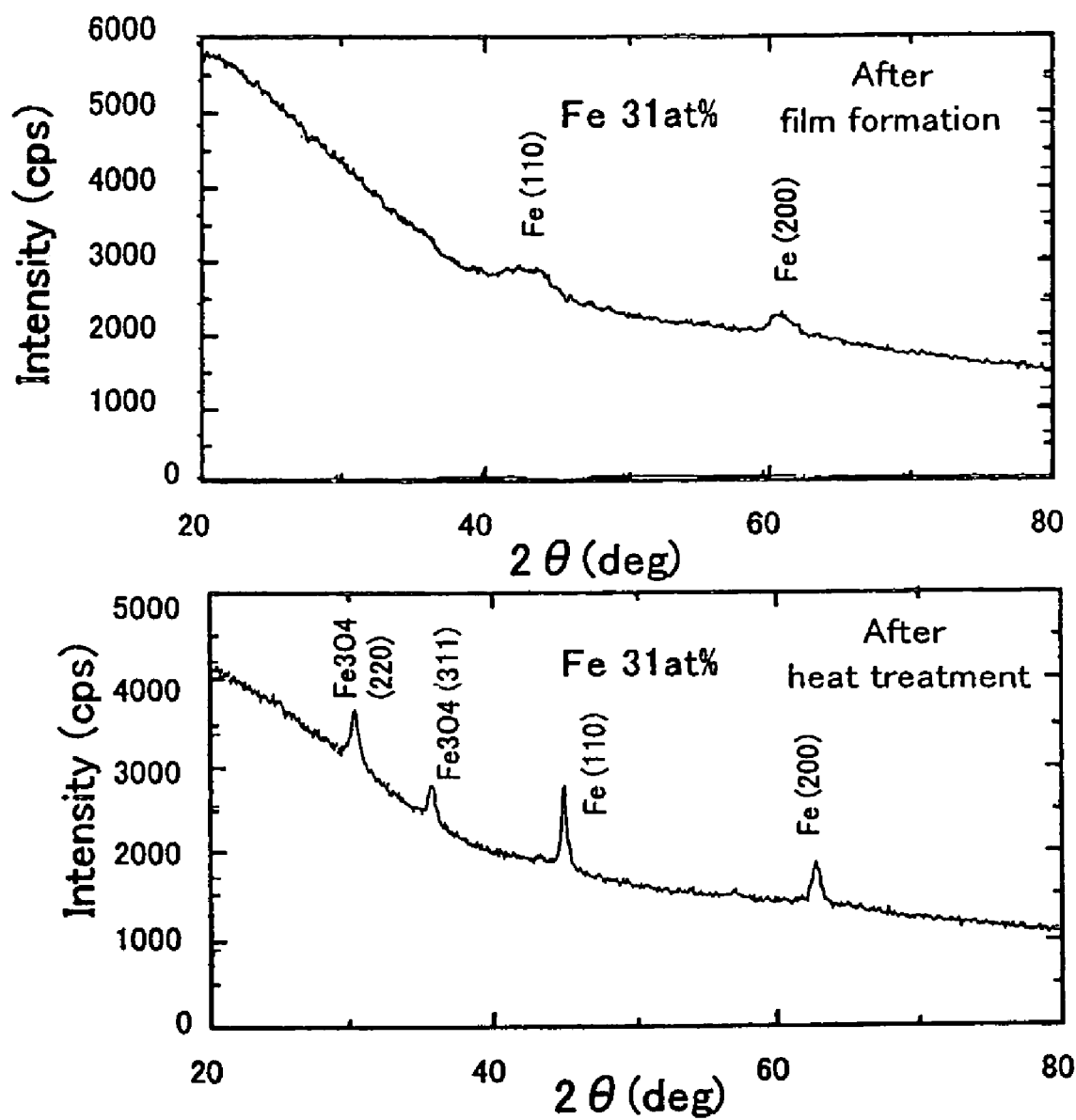
FIG. 9 is a view showing a X-ray diffraction profiles of the Fe—O film with Fe 31 at % added as deposition and after heat-treatment.

FIG. 9 shows X-ray diffraction curves representing the saturated flux densities of the Fe—O film with 31 at % of Fe added as deposition (a) and after heat-treatment (b). As known from the result, the structures of them are different before and after heat-treatment. As deposition (before heat treatment), the broad peaks corresponding to wider plane spacings than those of the normal Fe (110) are observed, indicating that the Fe—O film has a structure near to that of Fe, in which oxygen is dissolved. For this reason, it is suggested that most of magnetization is contributed by metal Fe rather than $Fe_3O_4$ in the composition phase. On the other hand, after heat-treatment, the peaks close to those of Fe (100), which the plane spacings were shifted to the narrow side, and the peaks corresponding to $Fe_3O_4$ (220) (311) are clearly observed. Thus, it is clear that $Fe_3O_4$ is deposited by heat treating the Fe—O film and a mixture film of Fe or Fe with oxygen dissolved and $Fe_3O_4$ was formed.

Figure 10:
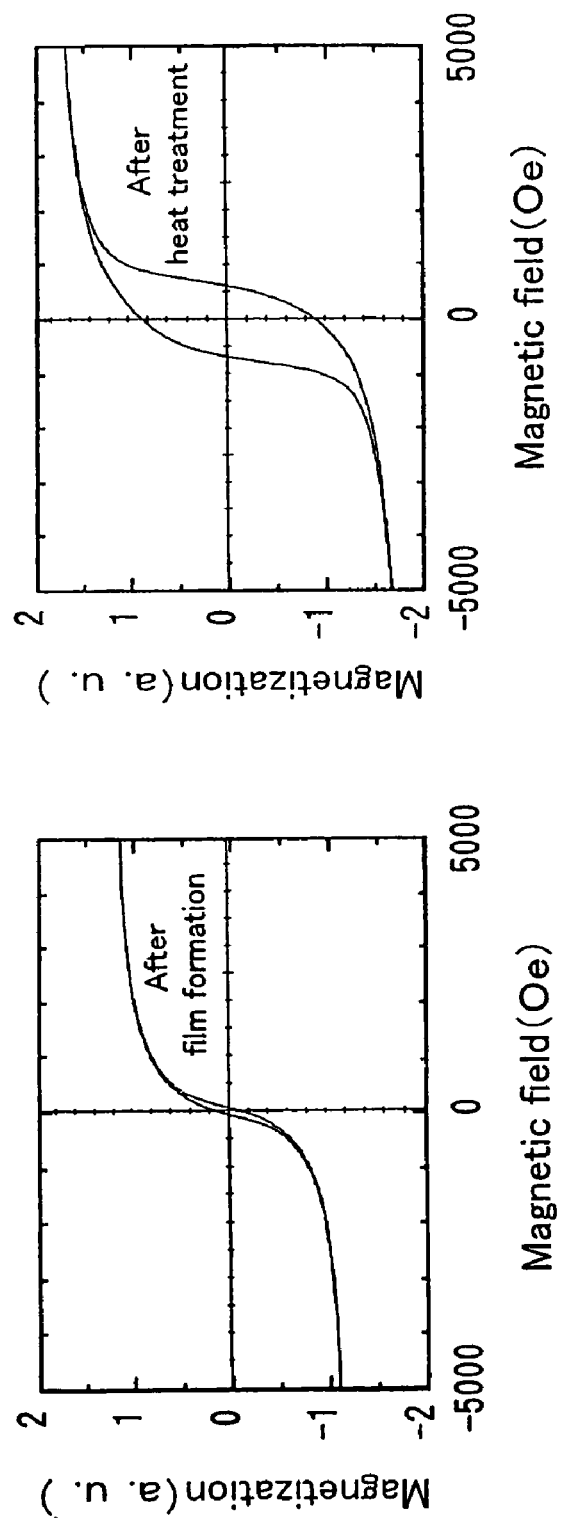
FIG. 10 is a characteristic drawing showing magnetization curves of the Fe—O film with Fe 31 at % added as deposition and after heat-treatment.

FIG. 10 shows the magnetization curves of the Fe—O film with 31 at % of Fe added as deposition (a) and after heat-treatment (b). The magnetization curve as deposition exhibits low coercivity and draws perpendicular magnetization loops, suggesting that ferromagnetic Fe or Fe—O particles are dispersed in its non-magnetic matrix. On the other hand, the magnetization curve after heat-treatment exhibits approx. 500 Oe of coercivity, suggesting that it reflects magnetocrystalline anisotropy of magnetite ($Fe_3O_4$) precipitated by heat-treatment.

Electric resistance of these Fe—O films depend on the film thickness. Approx. 0.3 μm thickness of film given here exhibits 1224 μΩcm as deposition and 566 μΩcm after heat-treatment.

Figure 11:
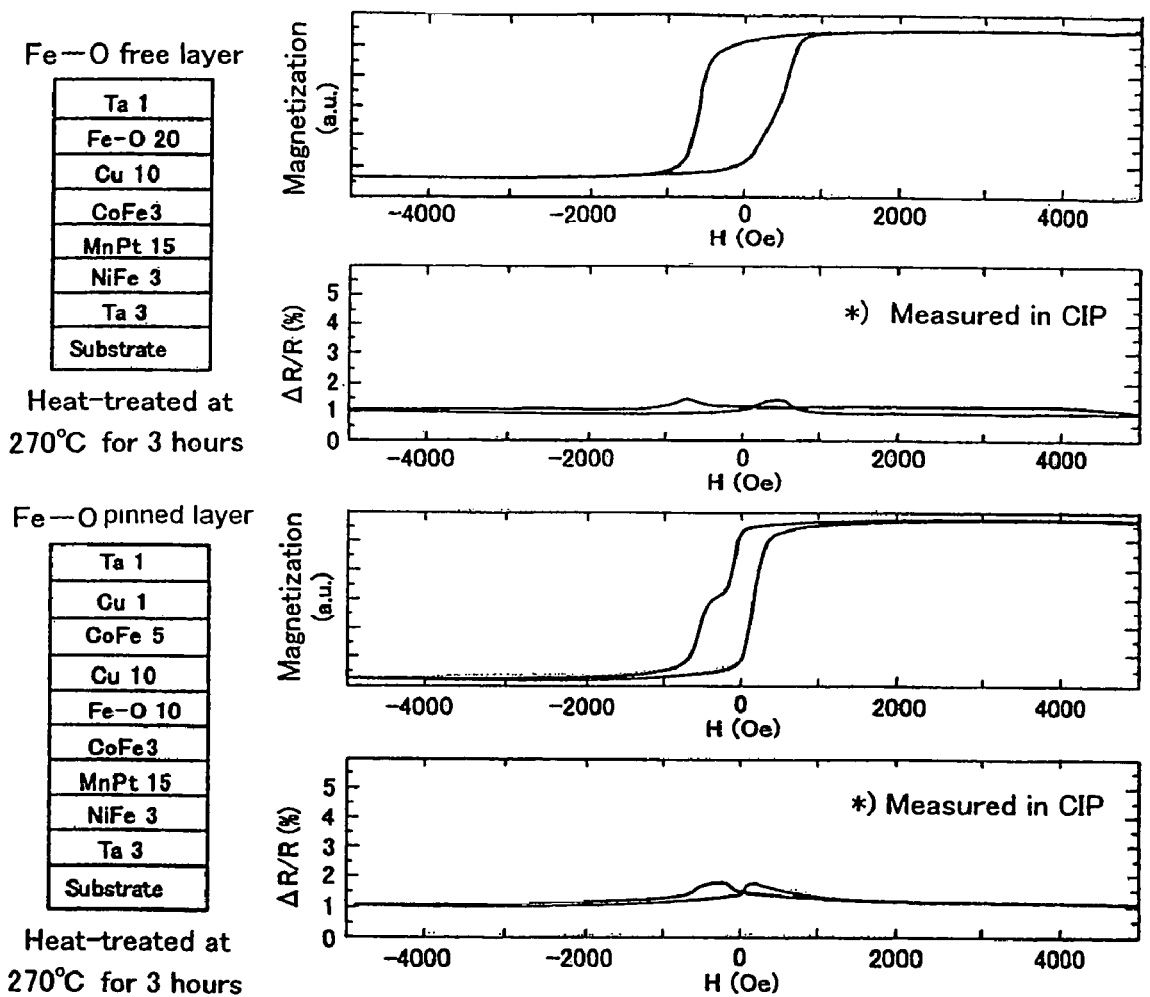
FIG. 11 is a characteristic drawing showing magnetization curves and magnetoresistive curves of a spin valve using the Fe—O film with Fe 31 at % added.

FIG. 11 shows the magnetization and magnetoresistive curves of the spin valve film when the Fe—O layer with Fe 31 at % added is used for the soft magnetic free layer and when it is used for ferromagnetic pinned layer. The Fe—O layers have 20 nm or 10 nm of thickness. The magnetoresistive curves were measured by supplying current in-plane, so called the CIP measuring method.

When the Fe—O layer is used for the soft magnetic free layer, no clear distinction can be observed between the magnetization curves of the ferromagnetic pinned layer and the soft magnetic free layer regardless of Cu non-magnetic intermediate layer being thick (10 nm). That is because the interlayer coupling between the ferromagnetic layer and the soft magnetic free layer is ferromagnetic. Note that as known from the amount of magnetization represented by the magnetization curve, the Fe—O layer used for the soft magnetic free layer is sufficiently strong. Thus, the magnetoresistive curve exhibits a low resistance of 1% or lower.

Similarly, when the Fe—O layer is used for ferromagnetic pinned layer, no clear distinction can be observed between the magnetization curves of the ferromagnetic pinned layer and the soft magnetic free layer regardless of Cu non-magnetic intermediate layer being thick (10 nm). Thus, the magnetoresistive curve exhibits a low resistance of 1% or lower. Note that as known from the amount of magnetization represented by the magnetization curve, the Fe—O layer used for the ferromagnetic pinned layer is sufficiently ferromagnetic and exchange coupling was achieved by forming the ferromagnetic pinned layer as the multilayer of Fe—O layer/CoFe layer in contact with the MnPt antiferromagnetic film.

Figure 12:
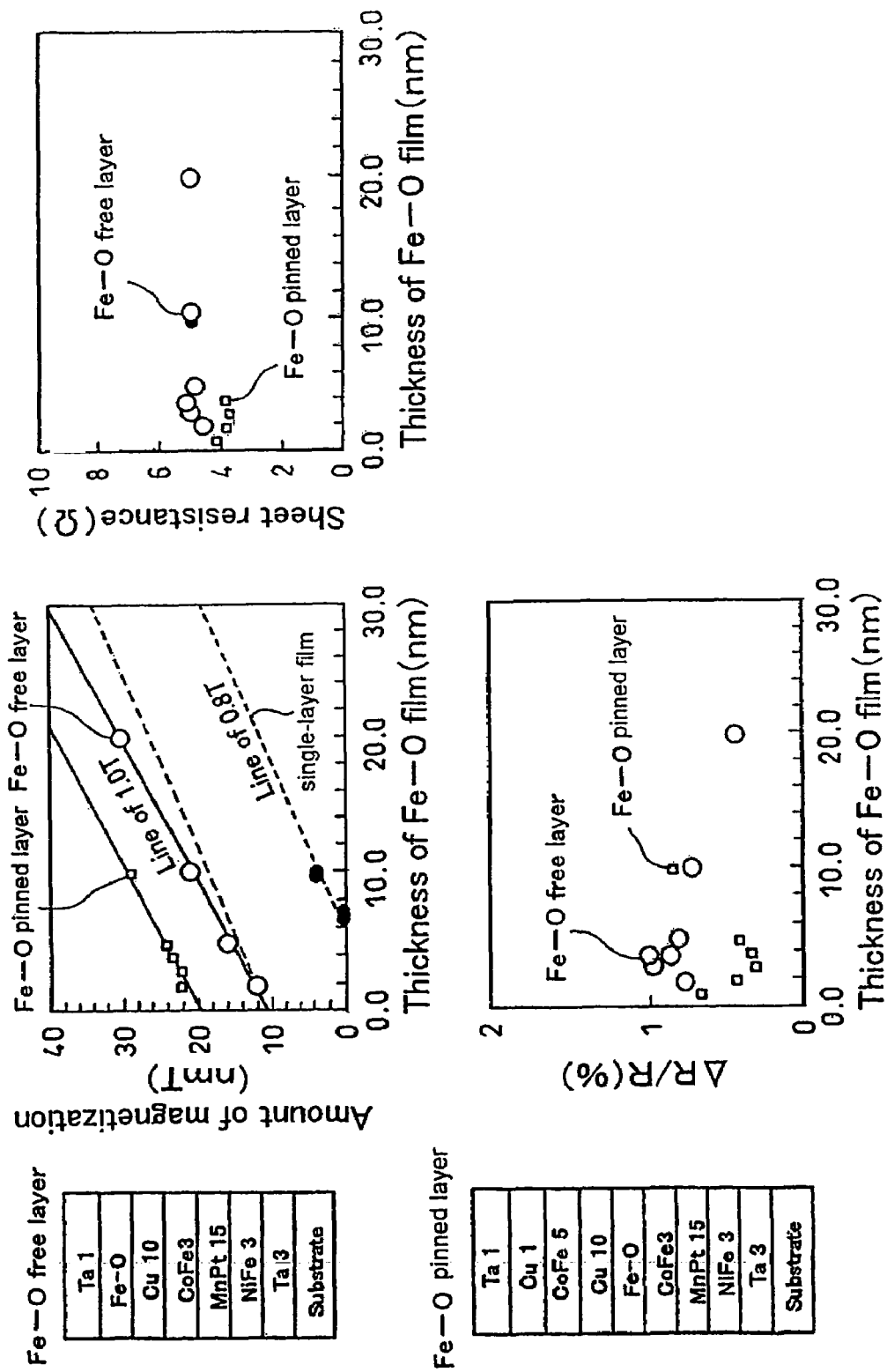
FIG. 12 is a characteristic drawing showing the thickness of the Fe—O layer, as well as the amount of magnetization, the sheet resistance, and the MR ratio of the spin valve.

FIG. 12 shows the relationship between the thickness of the Fe—O layer and the magnetization amount, sheet resistance, and MR ratio of the spin valve film. Similar to FIG. 11, The Fe—O layer is used for the soft magnetic free layer and ferromagnetic pinned layer. For convenient, the relationship between the thickness and the amount of magnetization of the Fe—O single-layer film is shown as well.

As known from the figure, the amount of magnetization of the Fe—O layer decreases gradually along a straight line corresponding to the approx. 0.8 tesla and reaches almost 0 (zero) when the thickness of the layer becomes thinner than 10 nm. On the other hand, it is also known that when the Fe—O layer is used for the spin valve layer, the magnetization amount is on the straight line corresponding to approx. 1 (one) tesla for both of the ferromagnetic pinned layer and the soft magnetic free layer and draws the straight line with a thickness of down to 1 nm in either case. This means that unlike the Fe—O monolayer, the Fe—O layer with in the spin valve, even if its thickness is thin, for example, 1-2 nm, may retains a high magnetization of one tesla. That may be because the effects given by the underlayer film of the spin valve film and formation of the Fe—O layer made from any of the materials, CoFe, Cu, and the like improve crystallinity.

Sheet resistance not so strongly depends on the thickness of the Fe—O layer. That is because the electric resistance of the Fe—O layer is higher than that of any other metal layer. The dependence of the MR ratio on the layer thickness varies between the ferromagnetic pinned layer and the soft magnetic free layer. When the Fe—O layer is used for the soft magnetic free layer, it may drop if the thickness of the Fe—O layer becomes thinner than 2 nm. That may be because when the Fe—O layer with a thickness of 1 nm is used for soft magnetic free layer, the amount of magnetization deviates from the straight line, indicating that the amount of magnetization is reduced. For the Fe—O layer with a thickness of any of 2-20 nm, however, the MR ratio increases as the layer thickness becomes thinner. This means that the interlayer coupling field decreases as the thickness of the Fe—O layer becomes thinner. On the other hand, when the Fe—O layer with a thickness of 10 nm or less is used for the ferromagnetic pinned layer, the MR ratio decreases but not increases. That may be because since the Cu layer is formed on the Fe—O layer, the substrate has effects on the Cu layer on the sufficiently thick Fe—O layer. With the layer thickness of 3 nm or less, the MR ratio increases again and it reaches a high value for the Fe—O layer with a thickness of 1 nm. This means that as the Fe—O layer becomes thinner, the interlayer coupling field is reduced. In addition, it means that the amount of magnetization of the Fe—O layer in the ferromagnetic pinned layer is better even if the layer thickness is 1 nm.

These result show that for the ferromagnetic pinned layer, the MR ratio is better even if the layer thickness is 1 nm, which is thinner than that for the soft magnetic free layer. That may be because if the Fe—O layer is disposed near to the ferromagnetic metal CoFe layer, the property of the thinner Fe—O layer is improved.

Figure 13:
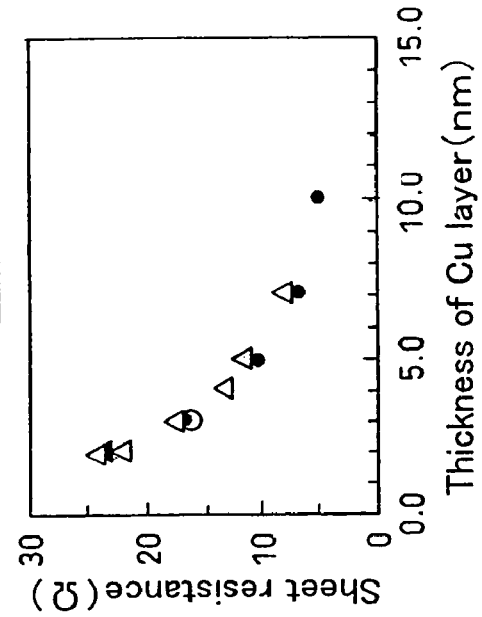
FIG. 13 is a characteristic drawing showing the relationship among the thickness of a Cu non-magnetic intermediate layer, the MR ratio and sheet resistance of the spin valve film.
Figure 13:
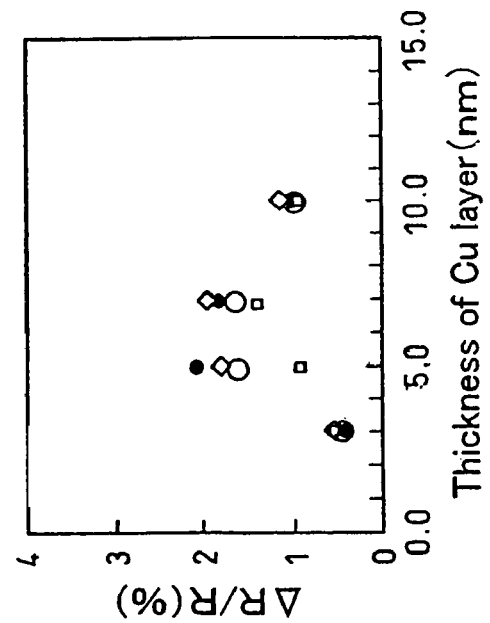
Figure 13:
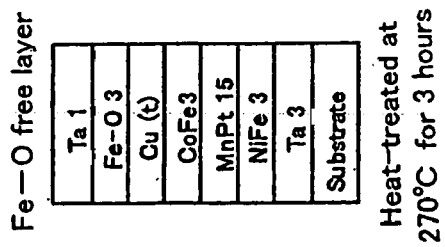

FIG. 13 is a view showing the amounts of Fe added to the Fe—O layer, the thickness of the Cu non-magnetic intermediate layer and the property of the spin valve film. The MR ratio increases as the Cu layer becomes thinner while it decreases when the interlayer coupling field become large even if the Cu layer is thin. As known from the figure, the Cu layer with a thickness of 10 nm exhibits almost the same MR ratio regardless of its composition, although the MR ratio begins to decrease in the Cu layer with a thickness of 7 nm when the amount of Fe added is 20 at % and continuously reduces in the Cu layer as the amount of Fe added increases. The MR ratio reaches the maximum value when the amount of Fe added is 40 at % and the high MR ratio is achieved when the amount of Fe added is any of 30-55 at %. In this composition, when the amount of Fe added increases up to 22-55% in the Fe—O layer, the MR ratio varies depending on it, that is, 20, 30, or 40 at %. on the other hand, the sheet resistance varies with the thickness of the Cu layer only but does not depend on the Fe composition.

Figure 14:
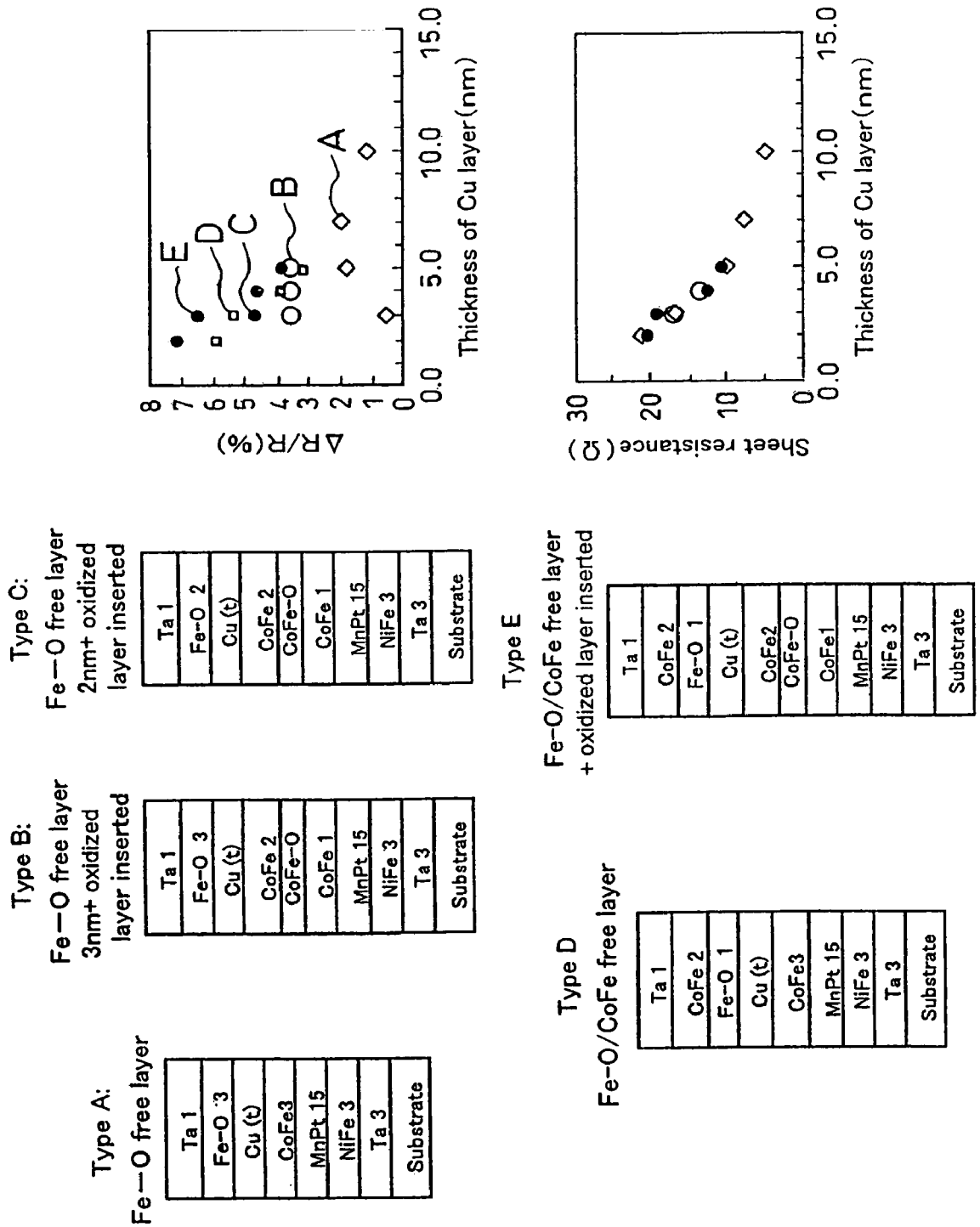
FIG. 14 is a characteristic drawing showing the relationship among the thickness of the Cu layer, the MR ratio, and the sheet resistance of the spin valves with various compositions using the Fe—O layer.

FIG. 14 is a view showing the relationship among the thickness of the Cu layers in the spin valve films, which have various compositions using the Fe—O layer, the MR ratio, and the sheet resistance. Types A, B, and C have the Fe—O layer only in the soft magnetic free layer while types D and E use the multi-layered construction of the Fe—O layer/ CoFe layer in the soft magnetic free layer. Types B, C, and E have the oxide inserting layer in the ferromagnetic pinned layer precipitated. A difference between the types B and C is in that the former has a thickness of 3 nm while the latter, 2 nm.

In the type A composition, the MR ratio does not increase even if the thickness of the Cu layer becomes thinner than 7 nm while in the type B composition, the MR ratio does not decease even if the thickness of the Cu layer becomes thinner than 3-5 nm, In addition, for types C-E, the MR ratio gradually increases until the Cu layer thickness reaches 2-3 nm and a high MR ratio, 5-7% is achieved. Thus, by reducing the thickness of the Fe—O layer, laminating the Fe—O layer with a thinner thickness of approx. 1 nm together with the CoFe layer and the like to form a multi-layer, and inserting the oxide layer into the pinned layer, a higher MR ratio can be achieved.

As known from the figure, the sheet resistance increases as the thickness of the Cu layer becomes thinner regardless of the combination of the fixes layer or the Fe—O layer and the CoFe layer.

Figure 15:
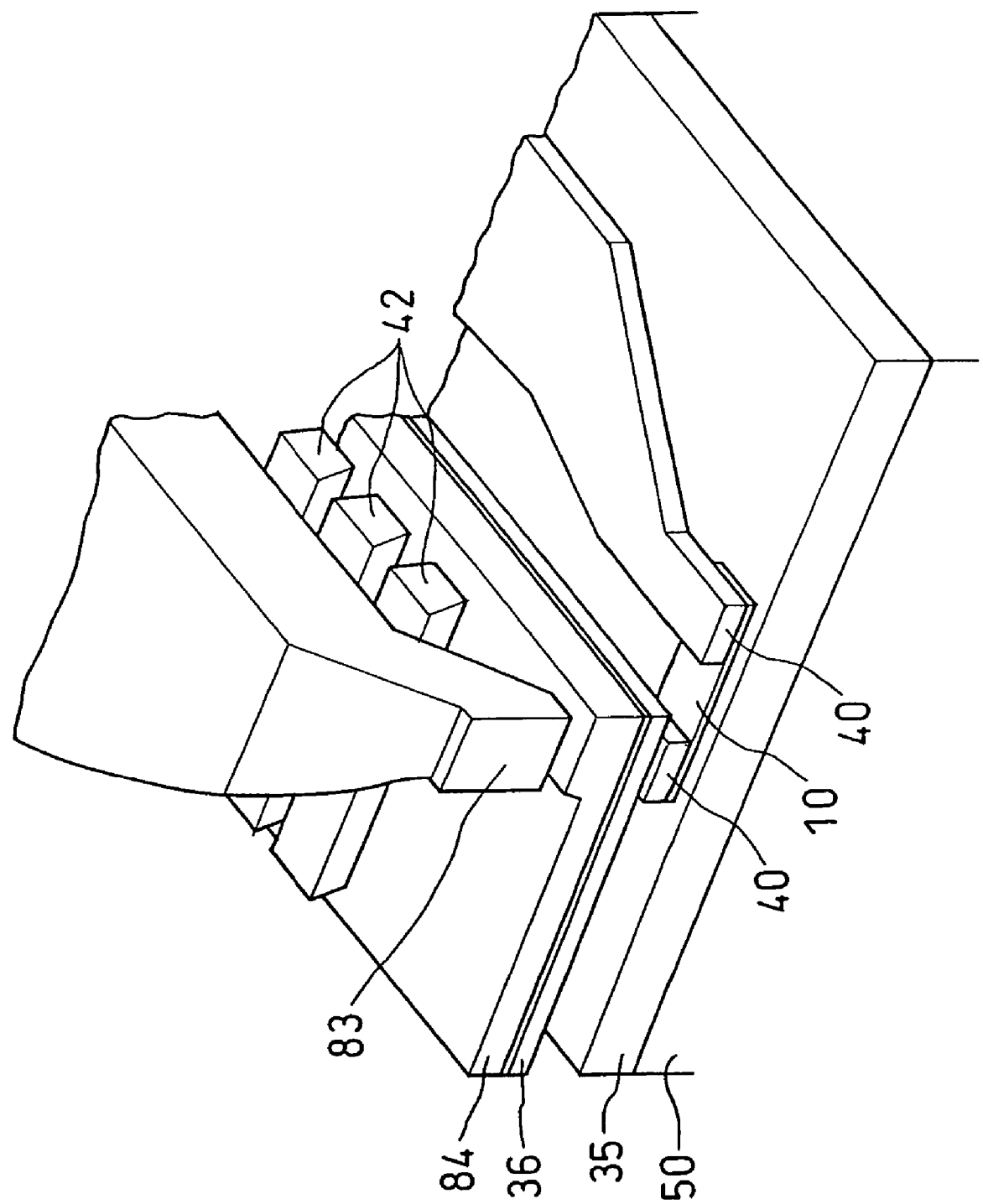
FIG. 15 is a schematic drawing showing the magnetic head mounting the magnetoresistive element of the present invention.

FIG. 15 is a schematic view showing the magnetic head mounting the magnetoresistive element of the present invention. The magnetoresistive multi-layered film 10, the magnetic domain control film (not shown), the electrode 40, the lower shield 35, the upper shield 36, the lower magnetic core 84, the coil 42, and the upper core 83 are formed on the substrate 50. In the figure, the magnetic head has the structure with the upper magnetic shield 36 and the lower magnetic core 84 disposed. Note that the use of the upper magnetic shield and the lower magnetic core, which are made from the same material, does not act contract to the purpose of the present invention.

Figure 16:
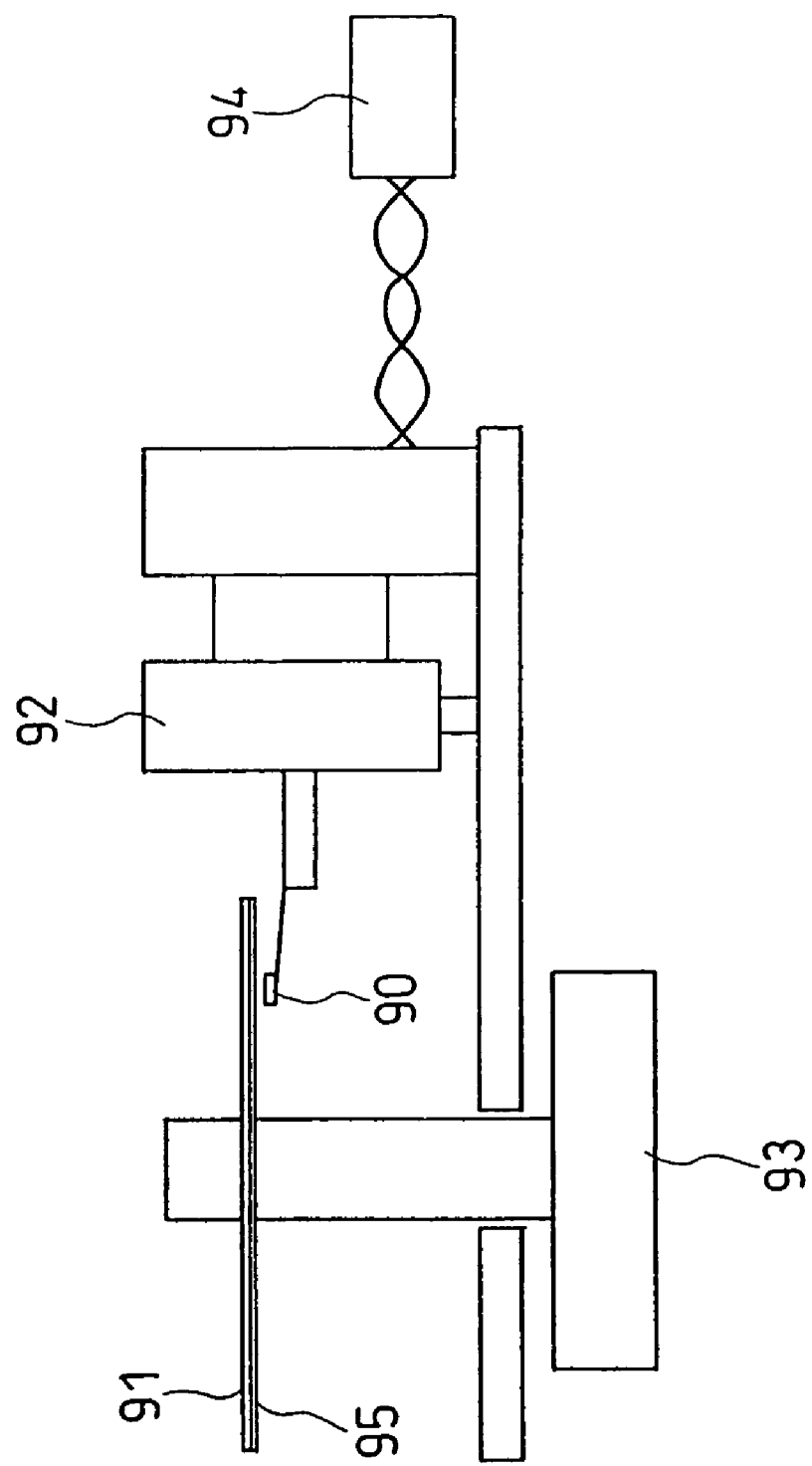
FIG. 16 is a block diagram showing the composition example of the magnetic recording/reproducing device of the present invention.

FIG. 16 a view showing an example of the magnetic recording/reproducing device of the present invention. In this example, a disk 95 holding a recording medium 91, which records magnetically information is rotated by means of a spindle motor 93, and a head slider 90 with the magnetic head attached shown in FIG. 15 is guided onto the track on the disk 95 by means of an actuator 92. This means that in the magnetic disk device, a reproducing head and recording head disposed at the head slider 95 are forced toward a given recording position through this mechanism to achieve the desired mutual movement, resulting in successful signal writing and reading. The actuator 92 is preferably of rotary actuator type.

Recording signals are recorded on the medium by means of the recording head through a signal processing system 94 and the output from the reproducing head is handled as reproducing signals through the signal processing system 94. in addition, when the reproducing head moves onto the desired recording track, the accurate positions on the track can be detected using high sensitivity of outputs from the reproducing head and the positioning of the head slider can be performed by controlling the actuator. In the figure, one head slider 90 and one disk 95 are shown, although more than one head sliders and disks may be used. Besides, the recording medium 91 may be disposed on both the sides of the disk 95 for recording information. When is desired that information is recorded on both sides of the disk, individual head sliders 90 are also disposed on both sides of the disk.

In another embodiment of the present invention, a method for manufacturing the above magnetoresistive element is provided. This method comprises the steps of: mixing the oxide of Co, Fe, Ni, Mn, and Cr or the mixed oxide thereof and metals Co, Fe, Ni, Mn, and Cr or alloys thereof by means of vacuum thin film formation such as simultaneous sputtering; and heat treating a resulting mixture at 200-400° C. to form said high-polarized layer.

In a further embodiment of the present invention, another method for manufacturing the above magnetoresistive elements provided. This method comprises the steps of: forming a metal thin film layer; and exposing said metal thin film layer to an atmosphere containing reactive gas such as oxygen for oxidization or chemical combination, thereby forming said high-polarized layer.

According to a still further aspect of the present invention, a magnetic head is provided in which a magnetism sensitive part comprises the above magnetoresistive element.

The result from the test on the magnetic head of the present invention and the magnetic recording/reproducing device mounting it shows that they exhibit sufficient outputs and better bias property, as well as well reliability of operation.

What is claimed is:

1. A magnetoresistive element having the multi-layered composition of a first ferromagnetic metal layer/a non-magnetic intermediate layer/a second ferromagnetic layer/an antiparallel coupling layer/a third ferromagnetic metal layer/an antiferromagnetic film, and said magnetoresistive element including elements, which allow said multi-layered composition to induce magnetoresistance when a relative magnetization angle defined between said ferromagnetic layers varies depending on an external magnetic field exerted, and at least one pair of electrodes for detecting the change in said magnetoresistance, wherein:

the magnetization of said third ferromagnetic layer is fixed substantially to the magnetic field to be sensed by means of said antiferromagnetic film and exchange coupling deposited on its whole surface by means of an exchange coupling force applied by said antiferromagnetic film, by which the magnetization of said second ferromagnetic layer is fixed substantially antiparallel to the magnetization orientation of said third ferromagnetic layer by means of the exchange coupling force applied by said antiparallel coupling layer, further by which the magnetization of said second ferromagnetic metal layer is fixed substantially to the magnetic field to be sensed, said second ferromagnetic layer is composed of the multi-layered construction of a high-polarized layer, which is a mixture of a ferromagnetic oxide and a ferromagnetic metal or a mixture of a ferromagnetic oxide with a high-polarization and the ferromagnetic metal, and a ferromagnetic metal sub-layer, said magnetoresistive element having the composition of the first ferromagnetic layer/the non-magnetic intermediate layer/the high-polarized layer/the ferromagnetic metal sub-layer, said first ferromagnetic layer is composed of the multi-layered construction of another high-polarized layer, which is a mixture of a ferromagnetic oxide and a ferromagnetic metal or a mixture of a ferromagnetic oxide with a high-polarization and the ferromagnetic metal, and another ferromagnetic metal sub-layer, and said magnetoresistive element having the composition of said another ferromagnetic metal sub-layer/said another high-polarized layer/the non-magnetic intermediate layer/the high-polarized layer/the ferromagnetic metal sub-layer.

2. The magnetoresistive element claimed in claim 1, wherein said high-polarized layer has a thickness of 0.5-5 nm.

3. The magnetoresistive element claimed in claim 1, wherein said non-magnetic intermediate layer is composed of at least one conductive metal selected from the group of Cu, Au, Ag, Al, Pt, Pd, Os, Re, Ru, Rh, and their alloys.

4. The magnetoresistive element claimed in claim 1, wherein said electrodes are structured so that a current is applied in the direction of a thickness of said multi-layered composition.

5. The magnetoresistive element claimed in claim 1, wherein said high-polarized layer has a thickness of 1-3 nm.

* * * * *